United States Patent
Sekiguchi et al.

(10) Patent No.: US 9,685,572 B2
(45) Date of Patent: Jun. 20, 2017

(54) PROTECTIVE SHEET FOR REAR SURFACE OF SOLAR CELL

(71) Applicant: TOYO ALUMINIUM KABUSHIKI KAISHA, Osaka-shi, Osaka (JP)

(72) Inventors: Fumiya Sekiguchi, Osaka (JP); Daisuke Maeda, Osaka (JP); Masataka Saruwatari, Osaka (JP)

(73) Assignee: TOYO ALUMINIUM KABUSHIKI KAISHA, Osaka-shi (JP)

( * ) Notice: Subject to any disclaimer, the term of this patent is extended or adjusted under 35 U.S.C. 154(b) by 93 days.

(21) Appl. No.: 14/423,299

(22) PCT Filed: Aug. 2, 2013

(86) PCT No.: PCT/JP2013/070967
§ 371 (c)(1),
(2) Date: Feb. 23, 2015

(87) PCT Pub. No.: WO2014/030522
PCT Pub. Date: Feb. 27, 2014

(65) Prior Publication Data
US 2015/0263206 A1  Sep. 17, 2015

(30) Foreign Application Priority Data
Aug. 24, 2012  (JP) ................. 2012-185151

(51) Int. Cl.
*H01L 31/049* (2014.01)
*C09J 175/04* (2006.01)
(Continued)

(52) U.S. Cl.
CPC ........ *H01L 31/049* (2014.12); *C08G 18/6225* (2013.01); *C08G 18/725* (2013.01);
(Continued)

(58) Field of Classification Search
CPC .............. C08G 18/6225; C08G 18/725; C08G 18/7642; C08G 18/792; C09J 175/04; H01L 31/049
See application file for complete search history.

(56) References Cited

U.S. PATENT DOCUMENTS 4,404,324 A * 9/1983 Fock ................. C08G 18/6237
524/413
2012/0012164 A1  1/2012 Sugiura et al.
(Continued)

FOREIGN PATENT DOCUMENTS

JP  2004-247390 A  9/2004
JP  2010024386 A * 2/2010 ............. C08G 18/72
(Continued)

OTHER PUBLICATIONS

Document N_English Translation.*
(Continued)

*Primary Examiner* — Michael L Leonard
(74) *Attorney, Agent, or Firm* — Westerman, Hattori, Daniels & Adrian, LLP

(57) ABSTRACT

A solar cell rear surface protection sheet having two or more substrates laminated together by means of an adhesive, the adhesive includes a urethane resin obtained by mixing an acrylic polyol, an isocyanate compound, 3-glycidoxypropyltriethoxysilane, and tin octylate. The acrylic polyol is obtained by polymerizing polymerizable monomers, which include a hydroxyl group-containing monomer and other monomers. The other monomers include acrylonitrile. The isocyanate compound includes both a xylylene diisocyanate monomer and hexamethylene diisocyanate isocyanurate, and the xylylene diisocyanate monomer is present in an amount of 20 to 40 wt %, and the hexamethylene diisocyanate isocyanurate is present in an amount of 80 to 60 wt %. The equivalent ratio of isocyanate groups of the xylylene diisocyanate monomer and the hexamethylene diisocyanate isocyanurate to hydroxyl groups of the acrylic polyol is 1.0 to 3.0.

12 Claims, 1 Drawing Sheet

(51) Int. Cl.
  *C08G 18/62* (2006.01)
  *C08G 18/72* (2006.01)
  *C08G 18/76* (2006.01)
  *C08G 18/79* (2006.01)
  *H01L 31/048* (2014.01)

(52) U.S. Cl.
  CPC ....... *C08G 18/7642* (2013.01); *C08G 18/792* (2013.01); *C09J 175/04* (2013.01); *H01L 31/0481* (2013.01); *Y02E 10/50* (2013.01)

(56) References Cited

U.S. PATENT DOCUMENTS

| | | | | |
|---|---|---|---|---|
| 2013/0317136 A1* | 11/2013 | Matsuki | ............ | C08G 18/3851 523/135 |
| 2014/0020758 A1 | 1/2014 | Ito et al. | | |

FOREIGN PATENT DOCUMENTS

| | | | | | |
|---|---|---|---|---|---|
| JP | 2010-238815 A | | 10/2010 | | |
| JP | 2010-263193 A | | 11/2010 | | |
| JP | 2011105819 A | * | 6/2011 | ............ | C09J 175/04 |
| JP | 2012-124357 A | | 6/2012 | | |
| JP | 2012-142349 A | | 7/2012 | | |
| JP | WO 2013077457 A2 | * | 5/2013 | ......... | C08G 18/6229 |
| WO | 2012/073859 A1 | | 6/2012 | | |

OTHER PUBLICATIONS

Document O_English Translation.*
International Search Report dated Sep. 3, 2013, issued in corresponding application No. PCT/JP2013/070967.

* cited by examiner

PROTECTIVE SHEET FOR REAR SURFACE OF SOLAR CELL

TECHNICAL FIELD

The present invention relates to a solar cell rear surface protection sheet and a solar cell module obtained using the solar cell rear surface protection sheet.

BACKGROUND ART

Making solar cells practical as energy sources has been promoted. Various types of solar cells have been developed. Known typical solar cells include silicon-based solar cells, inorganic compound-based solar cells, organic solar cells, and other solar cells.

A solar cell module has a front surface protection sheet disposed on the side on which sunlight is incident, to protect the surface. The solar cell module also has a solar cell rear surface protection sheet (solar cell back sheet) disposed on the opposite side to protect power generation cells. Such solar cell rear surface protection sheets are required to have weatherability, water resistance, heat resistance, moisture proof properties, gas barrier properties, and like properties to minimize deterioration in the long-term performance of solar cell modules.

To obtain solar cell rear surface protection sheets with the above properties, various films have hitherto been used. Examples of such films include metallic foils, metal plates, and metal vapor deposited films, such as aluminum, copper, and steel plates; films of plastics, such as polypropylene, polyvinyl chloride, polyesters, fluororesins, and acrylic resins; and the like. Laminates of these films are also used to further improve performance.

FIG. 1 illustrates an example of a laminate comprising films. A solar cell rear surface protection sheet 10 is a laminate of a plurality of films 11 and 12, and the films 11 and 12 are laminated together by means of an adhesive 13. A typical method for laminating films is dry lamination, and the adhesive 13 is required to have sufficient adhesion to the films 11 and 12.

FIG. 2 illustrates an example of a solar cell module. A solar cell module 1 comprises the solar cell rear surface protection sheet 10 in combination with a sealing member 20 for sealing power generation cells, power generation cells 30, a glass plate 40, and a frame 50.

The solar cell module 1, which is exposed to an outdoor environment over a long period of time, is required to have sufficient durability with regard to high temperature, humidity, and sunlight. In FIG. 1, particularly if the adhesive 13 were to have poor performance, the films 11 and 12 would peel off, thus impairing the appearance of the solar cell rear surface protection sheet 10 over time. Accordingly, the adhesive for solar cell rear surface protection sheets is required to be sufficient to prevent the films from being peeled off from each other even when the solar cell module 1 is exposed to an outdoor environment over a long period of time.

An example of such an adhesive for solar cell rear surface protection sheets is a urethane adhesive. Patent Literature 1 to 3 disclose adhesives for solar cell rear surface protection sheets, the adhesives containing a curing agent such as an isocyanate in combination with a polyol to improve durability and hydrolysis resistance.

Patent Literature 1 discloses, in the Examples, that a solar cell rear surface protection sheet was produced using a urethane-based adhesive for lamination. Patent Literature 2 and 3 disclose that an isocyanate curing agent was mixed with an acrylic polyol to produce an adhesive (see Tables 1 and 2 of Patent Literature 2 and Tables 1 and 2 of Patent Literature 3), and that a solar cell rear surface protection sheet with excellent long-term weatherability and hydrolysis resistance was produced using the adhesive.

Patent Literature 1 to 3 teach that a solar cell rear surface protection sheet prepared using an adhesive with excellent hydrolysis resistance and lamination strength allows for the prevention of deterioration in the appearance of a solar cell module. However, the types of films for use in solar cell rear surface protection sheets tend to increase year by year, and such films are designed to have high hydrophobicity to improve the hydrolysis resistance. Examples of materials with excellent hydrolysis resistance include linear low-density polyethylene (LLDPE), polyester films, fluorine-containing films, inorganic vapor deposited films, and the like. However, LLDPE, polyester films, fluorine-containing films, inorganic vapor deposited films, etc., are materials with poor adhesion. Thus, an inability to provide sufficient adhesion strength and the problem of sudden peeling, called zipping, are likely to occur. Additionally, since the weatherability of the films themselves is improving and higher performance is required for solar cell modules year by year, the performance required for adhesives for use in solar cell rear surface protection sheets is also inevitably increasing. Therefore, it can hardly be said that the solar cell rear surface protection sheets of Patent Literature 1 to 3 sufficiently satisfy consumer demand.

CITATION LIST

Patent Literature

PTL 1: JP2004-247390A
PTL 2: JP2010-238815A
PTL 3: JP2010-263193A

SUMMARY OF INVENTION

Technical Problem

The present invention provides an improved solar cell rear surface protection sheet comprising two or more substrates laminated together by means of an adhesive, the sheet exhibiting good adhesion strength and suppressing the occurrence of zipping even when the two or more substrates are poorly adhesive films.

Solution to Problem

The present inventors conducted extensive research to achieve the above object, and found that the object can be achieved when a solar cell rear surface protection sheet is obtained by laminating two or more substrates together by means of a specific adhesive. The present invention has been accomplished based on this finding.

More specifically, the present invention relates to the following solar cell rear surface protection sheet and solar cell module.

1. A solar cell rear surface protection sheet comprising two or more substrates laminated together by means of an adhesive, the adhesive comprising a urethane resin obtained by mixing an acrylic polyol, an isocyanate compound, 3-glycidoxypropyltriethoxysilane, and tin octylate;
(1) the acrylic polyol being an acrylic polyol obtained by polymerizing polymerizable monomers, the polymerizable monomers comprising a hydroxyl group-containing monomer and other monomers, the other monomers comprising acrylonitrile, the acrylonitrile being present in an amount of 5.0 to 15.0 wt % based on the total weight (100 wt %) of the polymerizable monomers;
(2) the isocyanate compound comprising both a xylene diisocyanate monomer and hexamethylene diisocyanate isocyanurate, wherein, based on the total weight (100 wt %) of the xylylene diisocyanate monomer and the hexamethylene diisocyanate isocyanurate, the xylylene diisocyanate monomer is present in an amount of 20 to 40 wt %, and the hexamethylene diisocyanate isocyanurate is present in an amount of 80 to 60 wt %;
(3) the equivalent ratio of isocyanate groups of the xylylene diisocyanate monomer and the hexamethylene diisocyanate isocyanurate to hydroxyl groups of the acrylic polyol being 1.0 to 3.0.

2. The solar cell rear surface protection sheet according to Item 1, wherein the two or more substrates are an outer layer substrate and an inner layer substrate, and the inner layer substrate is positioned in such a manner that the inner layer substrate faces power generation cells when a solar cell module is formed using the solar cell rear surface protection sheet.

3. The solar cell rear surface protection sheet according to Item 2, which comprises an intermediate layer substrate between the outer layer substrate and the inner layer substrate.

4. The solar cell rear surface protection sheet according to any one of Items 1 to 3, wherein the acrylic polyol has a glass transition temperature of −10° C. to 10° C.

5. The solar cell rear surface protection sheet according to any one of Items 1 to 4, wherein the acrylic polyol has a hydroxyl value of 5 to 30 mgKOH/g.

6. The solar cell rear surface protection sheet according to any one of Items 1 to 5, wherein the outer layer substrate and/or the inner layer substrate is formed by coating.

7. The solar cell rear surface protection sheet according to any one of Items 1 to 6, wherein the inner layer substrate comprises at least one member selected from the group consisting of ethylene-vinyl acetate copolymers (EVA) and low-density polyethylenes.

8. The solar cell rear surface protection sheet according to any one of Items 1 to 7, wherein the intermediate layer substrate comprises at least one member selected from the group consisting of polyesters, polyethylene naphthalates (PEN), polycarbonates, acrylic, polyamides, and polyphenylene ethers.

9. The solar cell rear surface protection sheet according to any one of Items 1 to 8, wherein the intermediate layer substrate comprises an aluminum foil and/or an inorganic vapor deposited film.

10. The solar cell rear surface protection sheet according to any one of Items 1 to 9, wherein a fluorine-containing coating and/or an acrylic coating is formed on an outer surface of the outer layer substrate.

11. The solar cell rear surface protection sheet according to any one of Items 2 to 5 and 7 to 10, wherein the outer layer substrate comprises at least one member selected from the group consisting of fluorine-containing films, polyester films, and inorganic vapor deposited films.

12. A solar cell module comprising the solar cell rear surface protection sheet according to any one of Items 1 to 11.

Advantageous Effects of Invention

Since two or more substrates are laminated together by means of a specific adhesive in the solar cell rear surface protection sheet of the present invention, the sheet exhibits good adhesion strength and suppresses the occurrence of zipping even when the two or more substrates are films that have hitherto been considered to be poorly adhesive.

When a solar cell module is formed using the solar cell rear surface protection sheet of the present invention, deterioration in the appearance of the solar cell module can be suppressed for a long period of time.

DESCRIPTION OF EMBODIMENTS

Figure 1:
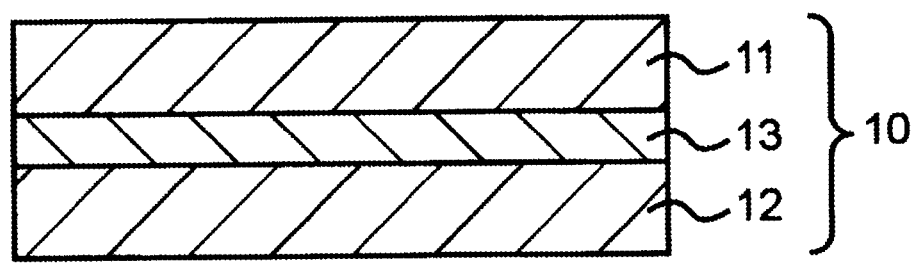
FIG. 1 is a cross-sectional view illustrating one embodiment of the solar cell rear surface protection sheet of the present invention.
Figure 2:
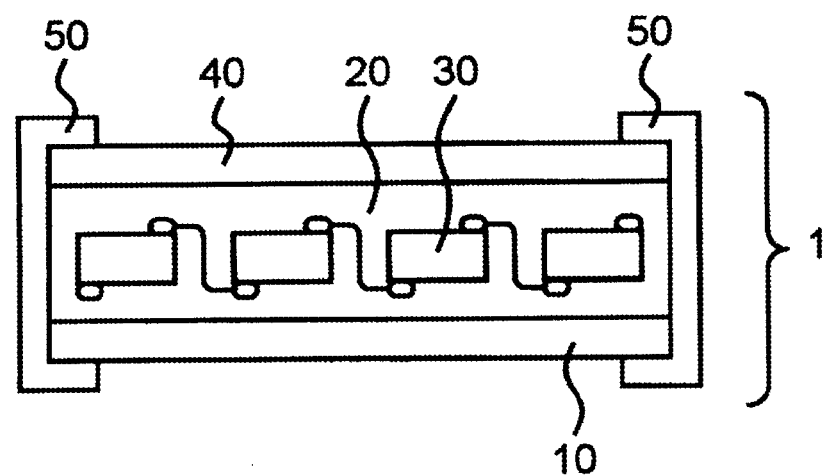
FIG. 2 is a cross-sectional view illustrating one embodiment of the solar cell module of the present invention.

The solar cell rear surface protection sheet of the present invention comprises two or more substrates laminated together by means of an adhesive, the adhesive comprising a urethane resin obtained by mixing an acrylic polyol, an isocyanate compound, 3-glycidoxypropyltriethoxysilane, and tin octylate;
(1) the acrylic polyol being an acrylic polyol obtained by polymerizing polymerizable monomers, the polymerizable monomers comprising a hydroxyl group-containing monomer and other monomers, the other monomers comprising acrylonitrile, the acrylonitrile being present in an amount of 5.0 to 15.0 wt % based on the total weight (100 wt %) of the polymerizable monomers;
(2) the isocyanate compound comprising both a xylylene diisocyanate monomer and hexamethylene diisocyanate isocyanurate, wherein, based on the total weight (100 wt %) of the xylylene diisocyanate monomer and the hexamethylene diisocyanate isocyanurate, the xylylene diisocyanate monomer is present in an amount of 20 to 40 wt %, and the hexamethylene diisocyanate isocyanurate is present in an amount of 80 to 60 wt %;
(3) the equivalent ratio of isocyanate groups of the xylylene diisocyanate monomer and the hexamethylene diisocyanate isocyanurate to hydroxyl groups of the acrylic polyol being 1.0 to 3.0.

Since the solar cell rear surface protection sheet of the present invention having the above features comprises two or more substrates laminated together by means of a specific adhesive, it has good adhesion strength and suppresses the occurrence of zipping even when the two or more substrates are conventional, poorly adhesive films (e.g., fluorine-containing films, hydrolysis-resistant polyesters, and the like). In particular, the specific adhesive used in the present invention has sufficient electrical insulation and further can maintain good performance also in an accelerated aging test. Therefore, the solar cell rear surface protection sheet of the present invention is highly useful.

The solar cell rear surface protection sheet of the present invention may be designed to have, for example, two layers, i.e., an outer layer substrate and an inner layer substrate, as the two or more substrates, wherein the inner layer substrate is positioned in such a manner that the inner layer substrate faces power generation cells when a solar cell module is formed using the solar cell rear surface protection sheet. The solar cell rear surface protection sheet of the present invention may also be designed to have an intermediate layer substrate between the outer layer substrate and the inner layer substrate. In such a case, it is preferable to use a substrate with weatherability as the outer layer substrate, a substrate with voltage resistance as the intermediate layer substrate, and a substrate having good adhesion to a sealing member for sealing power generation cells as the inner layer substrate.

Substrates used for known solar cell rear surface protection sheets may be used as the outer layer substrate, the inner layer substrate, and the intermediate layer substrate. The following is a more specific explanation thereof.

Films usable for the outer layer substrate may contain one or more types of resin components and be stretched uniaxially or biaxially. For example, fluorine-containing films, polyester films, and inorganic vapor deposited films are preferably used. More preferable examples include polyvinyl fluoride (PVF), polyvinylidene fluoride (PVDF), hydrolysis-resistant polyesters, and the like. In addition, a fluorine-containing coating and/or an acrylic coating may be formed on the surface, on the side that is exposed to the air, of a film used for the outer layer substrate.

There is no limitation on the thickness of the outer layer substrate; the thickness of the outer layer substrate is preferably about 10 to about 100 μm.

Examples of films usable for the intermediate layer substrate include films obtained from polyesters, polyethylene naphthalates (PEN), polycarbonates, acrylic, polyamides, polyphenylene ethers, aluminum foils, inorganic vapor deposited films, and the like. The resins mentioned as examples may be used singly or in a combination of two or more. Polyesters and hydrolysis-resistant polyesters are more preferable. The intermediate layer substrate may be single-layered or multilayered.

There is no limitation on the thickness of the intermediate layer substrate; the thickness of the intermediate layer substrate is preferably 30 to 250 μm.

As the inner layer substrate, at least one member selected from the group consisting of low-density polyethylenes, ethylene-vinyl acetate copolymers (EVA), and the like are, for example, preferably used.

There is no limitation on the thickness of the inner layer substrate; the thickness of the inner layer substrate is preferably 30 to 250 μm.

In the present invention, the above-described substrates are laminated together by means of the specific adhesive described below.

The adhesive used in the present invention comprises a urethane resin obtained by mixing an acrylic polyol, an isocyanate compound, 3-glycidoxypropyltriethoxysilane, and tin octylate. Here, 3-glycidoxypropyltriethoxysilane is a silane coupling agent, and tin octylate is a curing catalyst.

The acrylic polyol is obtained by polymerizing polymerizable monomers. "Polymerizable monomers" comprise a "hydroxyl group-containing monomer" and "other monomers." "Other monomers" comprise acrylonitrile, and the acrylonitrile is present in an amount of 5.0 to 15.0 wt % based on the total weight (100 wt %) of the "polymerizable monomers." "Other monomers" refer to "ethylenic double bond-containing radical polymerizable monomers" other than the hydroxyl group-containing monomer.

If the content of the above-mentioned acrylonitrile is less than 5.0 wt % based on the total weight (100 wt %) of the polymerizable monomers, the adhesion performance to each substrate may decrease, whereas if it exceeds 15.0 wt %, the initial bonding ability, the adhesion performance to each substrate, and like properties may decrease.

The isocyanate compound contains both a xylylene diisocyanate monomer and hexamethylene diisocyanate isocyanurate. Based on the total weight (100 wt %) of the xylylene diisocyanate monomer and the hexamethylene diisocyanate isocyanurate, the xylylene diisocyanate monomer is present in an amount of 20 to 40 wt %, and the hexamethylene diisocyanate isocyanurate is present in an amount of 80 to 60 wt %.

If the content of the xylylene diisocyanate monomer is less than 20 wt %, the adhesion performance to EVA, which is often used for an inner layer substrate, may decrease. In addition, zipping may occur between PVF or PVDF, which is often used for an outer layer substrate, and PET, which is often used for an intermediate layer substrate. Further, if the content of the xylylene diisocyanate monomer exceeds 40 wt %, the initial appearance may be impaired due to foaming, resulting in wrinkling or the like.

In addition, the acrylic polyol preferably has a glass transition temperature of −10° C. to 10° C. This is because if the glass transition temperature of the acrylic polyol is less than −10° C., the resulting adhesive becomes too soft, and consequently the adhesion strength and the shape retention tend to decrease, whereas if the glass transition temperature of the acrylic polyol exceeds 10° C., the resulting adhesive becomes hard and brittle, resulting in a decrease in strength.

Further, the acrylic polyol preferably has a hydroxyl value (OH value) of 5 to 30 mgKOH/g. If the hydroxyl value of the acrylic polyol is less than 5 mgKOH/g, the adhesion performance to each substrate may decrease. If the hydroxyl value of the acrylic polyol exceeds 30 mgKOH/g, the initial adhesion performance and the adhesion performance after a heat resistance test may decrease.

Further, in the adhesive used in the present invention, the equivalent ratio of isocyanate groups of the xylylene diisocyanate monomer and the hexamethylene diisocyanate isocyanurate to hydroxyl groups of the acrylic polyol is 1.0 to 3.0.

If the equivalent ratio is less than 1.0, the initial adhesion performance to each substrate and the adhesion performance to each substrate after a heat resistance test may decrease. If the equivalent ratio exceeds 3.0, the adhesion performance to each substrate after a heat resistance test may decrease.

When a solar cell module is produced using the solar cell rear surface protection sheet of the present invention, it may have any known configuration except that, in particular, the above-described adhesive is used as a material for forming the solar cell rear surface protection sheet. More specifically, any known configuration may be used for the film layer structure of the solar cell rear surface protection sheet, except for the adhesive thereof; any known configuration may also be used for, for example, materials for forming solar cell modules, such as power generation cells, sealing members for sealing power generation cells, glass plates, and frames.

EXAMPLES

Examples, Comparative Examples, and Test Example are given below to further clarify the features of the present invention, but the scope of the present invention is not limited to these Examples.

Example 1

A linear low-density polyethylene (LLDPE) resin composition was prepared by adding 25 kg of titanium oxide particles to 100 kg of a polyethylene resin with a density of 0.91 g/cm$^3$ and sufficiently kneading the mixture. This LLDPE resin composition was extruded with an extruder to obtain an inner layer substrate with a thickness of 50 μm.

A polyethylene terephthalate film with a thickness of 250 μm (produced by Toyobo Co., Ltd.; Toyobo ester film E5102) was prepared as an intermediate layer substrate having excellent electrical insulation.

A PVF film (produced by DuPont, 38 μm) was prepared as an outer layer substrate.

As an adhesive, a urethane resin was obtained by mixing 7.8 parts by weight of Lexp 11-1, an isocyanate compound produced by Henkel Japan Ltd. (containing a xylylene diisocyanate monomer in an amount of 30 parts by weight and hexamethylene diisocyanate isocyanurate in an amount of 70 parts by weight; the NCO group percentage is 28.7%), with 100 parts by weight (dry weight) of Lexp 10-3, an acrylic polyol produced by Henkel Japan Ltd. (an acrylic polyol obtained by polymerizing a mixture containing 5 parts by weight of acrylonitrile, a hydroxyl group-containing monomer, and other monomer(s), and to which 3-glycidoxypropyltriethoxysilane and tin octylate are added; the acrylic polyol has a glass transition temperature of 0° C. and an OH value of 15 mgKOH/g). The equivalent ratio of isocyanate groups of the xylylene diisocyanate monomer and the hexamethylene diisocyanate isocyanurate to hydroxyl groups of the acrylic polyol was 2.0.

The above-described outer layer substrate, intermediate layer substrate, and inner layer substrate were bonded in this order by lamination with 7 g/m² of the above-mentioned adhesive, thereby obtaining a solar cell rear surface protection sheet.

Example 2

A solar cell rear surface protection sheet was obtained in the same manner as in Example 1 except that Lexp 10-4 produced by Henkel Japan Ltd. (using 10 parts by weight of acrylonitrile instead of 5 parts by weight as in Lexp 10-3) was used as an acrylic polyol.

Example 3

A solar cell rear surface protection sheet was obtained in the same manner as in Example 1 except that Lexp 10-5 produced by Henkel Japan Ltd. (using 15 parts by weight of acrylonitrile instead of 5 parts by weight as in Lexp 10-3) was used as an acrylic polyol.

Example 4

A solar cell rear surface protection sheet was obtained in the same manner as in Example 2 except that Lexp 10-7 produced by Henkel Japan Ltd. (having a glass transition temperature of −10° C. instead of 0° C. as in Lexp 10-4) was used as an acrylic polyol.

Example 5

A solar cell rear surface protection sheet was obtained in the same manner as in Example 2 except that Lexp 10-8 produced by Henkel Japan Ltd. (having a glass transition temperature of 10° C. instead of 0° C. as in Lexp 10-4) was used as an acrylic polyol.

Example 6

A solar cell rear surface protection sheet was obtained in the same manner as in Example 2 except that Lexp 10-9 produced by Henkel Japan Ltd. (having a glass transition temperature of −15° C. instead of 0° C. as in Lexp 10-4) was used as an acrylic polyol.

Example 7

A solar cell rear surface protection sheet was obtained in the same manner as in Example 2 except that Lexp 10-10 produced by Henkel Japan Ltd. (having a glass transition temperature of 15° C. instead of 0° C. as in Lexp 10-4) was used as an acrylic polyol.

Example 8

A solar cell rear surface protection sheet was obtained in the same manner as in Example 2 except that Lexp 10-11 produced by Henkel Japan Ltd. (having an OH value of 5 mgKOH/g instead of 15 mgKOH/g as in Lexp 10-4) was used as an acrylic polyol and that the amount of isocyanate compound Lexp 11-1 per 100 parts by weight of the acrylic polyol was changed from 7.8 parts by weight to 5.2 parts by weight.

Example 9

A solar cell rear surface protection sheet was obtained in the same manner as in Example 2 except that Lexp 10-12 produced by Henkel Japan Ltd. (having an OH value of 30 mgKOH/g instead of 15 mgKOH/g as in Lexp 10-4) was used as an acrylic polyol and that the amount of isocyanate compound Lexp 11-1 per 100 parts by weight of the acrylic polyol was changed from 7.8 parts by weight to 15.6 parts by weight.

Example 10

A solar cell rear surface protection sheet was obtained in the same manner as in Example 2 except that Lexp 10-13 produced by Henkel Japan Ltd. (having an OH value of 3 mgKOH/g instead of 15 mgKOH/g as in Lexp 10-4) was used as an acrylic polyol and that the amount of isocyanate compound Lexp 11-1 per 100 parts by weight of the acrylic polyol was changed from 7.8 parts by weight to 2.6 parts by weight.

Example 11

A solar cell rear surface protection sheet was obtained in the same manner as in Example 2 except that Lexp 10-14 produced by Henkel Japan Ltd. (having an OH value of 40 mgKOH/g instead of 15 mgKOH/g as in Lexp 10-4) was used as an acrylic polyol and that the amount of isocyanate compound Lexp 11-1 per 100 parts by weight of the acrylic polyol was changed from 7.8 parts by weight to 20.9 parts by weight.

Example 12

A solar cell rear surface protection sheet was obtained in the same manner as in Example 1 except that a hydrolysis-resistant polyester film (X10s produced by Toray Industries, Inc., 50 μm), which is a poorly adhesive film, was used as an outer layer substrate and that a layer structure of outer layer substrate/adhesive/inner layer substrate was employed without using an intermediate layer substrate.

Comparative Example 1

A solar cell rear surface protection sheet was obtained in the same manner as in Example 1 except that Lexp 10-1 produced by Henkel Japan Ltd. (using 0 parts by weight of acrylonitrile instead of 5 parts by weight as in Lexp 10-3) was used as an acrylic polyol.

Comparative Example 2

A solar cell rear surface protection sheet was obtained in the same manner as in Example 1 except that Lexp 10-2 produced by Henkel Japan Ltd. (using 3 parts by weight of acrylonitrile instead of 5 parts by weight as in Lexp 10-3) was used as an acrylic polyol.

Comparative Example 3

A solar cell rear surface protection sheet was obtained in the same manner as in Example 1 except that Lexp 10-6 produced by Henkel Japan Ltd. (using 25 parts by weight of acrylonitrile instead of 5 parts by weight as in Lexp 10-3) was used as an acrylic polyol.

Comparative Example 4

A solar cell rear surface protection sheet was obtained in the same manner as in Example 2 except that Lexp 11-2 produced by Henkel Japan Ltd. (containing a xylylene diisocyanate monomer in an amount of 10 parts by weight and hexamethylene diisocyanate isocyanurate in an amount of 90 parts by weight; the NCO group percentage is 24.1%) was used as an isocyanate compound and that the amount of isocyanate compound Lexp 11-2 per 100 parts by weight of the acrylic polyol was 9.3 parts by weight.

Comparative Example 5

A solar cell rear surface protection sheet was obtained in the same manner as in Example 2 except that Lexp 11-3 produced by Henkel Japan Ltd. (containing a xylylene diisocyanate monomer in an amount of 50 parts by weight and hexamethylene diisocyanate isocyanurate in an amount of 50 parts by weight; the NCO group percentage is 33.3%) was used as an isocyanate compound and that the amount of isocyanate compound Lexp 11-3 per 100 parts by weight of the acrylic polyol was 6.7 parts by weight.

Comparative Example 6

A solar cell rear surface protection sheet was obtained in the same manner as in Example 2 except that the amount of isocyanate compound Lexp 11-1 per 100 parts by weight of acrylic polyol Lexp 10-4 was 3.1 parts by weight and that the equivalent ratio of isocyanate groups of the xylylene diisocyanate monomer and the hexamethylene diisocyanate isocyanurate to hydroxyl groups of the acrylic polyol was 0.8.

Comparative Example 7

A solar cell rear surface protection sheet was obtained in the same manner as in Example 2 except that the amount of isocyanate compound Lexp 11-1 per 100 parts by weight of acrylic polyol Lexp 10-4 was 13.7 parts by weight and that the equivalent ratio of isocyanate groups of the xylylene diisocyanate monomer and the hexamethylene diisocyanate isocyanurate to hydroxyl groups of the acrylic polyol was 3.5.

Comparative Example 8

A solar cell rear surface protection sheet was obtained in the same manner as in Example 2 except that Lexp 10-15 produced by Henkel Japan Ltd. (similar to Lexp 10-4, but does not contain 3-glycidoxypropyltriethoxysilane) was used as an acrylic polyol.

Comparative Example 9

A solar cell rear surface protection sheet was obtained in the same manner as in Example 2 except that Lexp 10-16 produced by Henkel Japan Ltd. (similar to Lexp 10-4, but uses no hydroxyl group-containing monomer and has an OH value of 0 mgKOH/g instead of 15 mgKOH/g) was used as an acrylic polyol.

Comparative Example 10

A solar cell rear surface protection sheet was obtained in the same manner as in Example 2 except that Lexp 10-17 produced by Henkel Japan Ltd. (similar to Lexp 10-4, but does not contain tin octylate) was used as an acrylic polyol.

Comparative Example 11

A solar cell rear surface protection sheet was obtained in the same manner as in Example 1 except that a mixture of Takelac A-315 and Takenate A-50 at a ratio (weight ratio) of 100:10 was used as an adhesive. The adhesive did not contain 3-glycidoxypropyltriethoxysilane.

Comparative Example 12

A solar cell rear surface protection sheet was obtained in the same manner as in Comparative Example 11 except that a hydrolysis-resistant polyester film (X10s produced by Toray Industries, Inc., 50 μm), which is a poorly adhesive film, was used as an outer layer substrate and that a layer structure of outer layer substrate/adhesive/inner layer substrate was employed without using an intermediate layer substrate.

The properties of Lexp 10-1 to Lexp 10-17 and Lexp 11-1 to Lexp 11-3 used in the Examples and Comparative Examples are summarized in Tables 1 and 2 below.

TABLE 1

| # | Product Number Unit | Component | AN Amount wt % | Hydroxyl Group-containing Monomer | Other Monomer(s) | 3-glycidoxy-propyl-triethoxysilane | Tin Octylate | Tg (° C.) | OH Value mgKOH/g |
|---|---|---|---|---|---|---|---|---|---|
| 1 | Lexp 10-1 | Acrylic Polyol | 0 | Containing | Containing | Containing | Containing | 0 | 15 |
| 2 | Lexp 10-2 | Acrylic Polyol | 3 | Containing | Containing | Containing | Containing | 0 | 15 |

TABLE 1-continued

| # | Product Number Unit | Component | AN Amount wt % | Hydroxyl Group-containing Monomer | Other Monomer(s) | 3-glycidoxy-propyl-triethoxysilane | Tin Octylate | Tg (° C.) | OH Value mgKOH/g |
|---|---|---|---|---|---|---|---|---|---|
| 3 | Lexp 10-3 | Acrylic Polyol | 5 | Containing | Containing | Containing | Containing | 0 | 15 |
| 4 | Lexp 10-4 | Acrylic Polyol | 10 | Containing | Containing | Containing | Containing | 0 | 15 |
| 5 | Lexp 10-5 | Acrylic Polyol | 15 | Containing | Containing | Containing | Containing | 0 | 15 |
| 6 | Lexp 10-6 | Acrylic Polyol | 25 | Containing | Containing | Containing | Containing | 0 | 15 |
| 7 | Lexp 10-7 | Acrylic Polyol | 10 | Containing | Containing | Containing | Containing | −10 | 15 |
| 8 | Lexp 10-8 | Acrylic Polyol | 10 | Containing | Containing | Containing | Containing | 10 | 15 |
| 9 | Lexp 10-9 | Acrylic Polyol | 10 | Containing | Containing | Containing | Containing | −15 | 15 |
| 10 | Lexp 10-10 | Acrylic Polyol | 10 | Containing | Containing | Containing | Containing | 15 | 15 |
| 11 | Lexp 10-11 | Acrylic Polyol | 10 | Containing | Containing | Containing | Containing | 0 | 5 |
| 12 | Lexp 10-12 | Acrylic Polyol | 10 | Containing | Containing | Containing | Containing | 0 | 30 |
| 13 | Lexp 10-13 | Acrylic Polyol | 10 | Containing | Containing | Containing | Containing | 0 | 3 |
| 14 | Lexp 10-14 | Acrylic Polyol | 10 | Containing | Containing | Containing | Containing | 0 | 40 |
| 15 | Lexp 10-15 | Acrylic Polyol | 10 | Containing | Containing | Not Containing | Containing | 0 | 15 |
| 16 | Lexp 10-16 | Acrylic Polyol | 10 | Not Containing | Containing | Containing | Containing | 0 | 0 |
| 17 | Lexp 10-17 | Acrylic Polyol | 10 | Containing | Containing | Containing | Not Containing | 0 | 15 |

In Table 1, the AN amount indicates acrylonitrile content.

TABLE 2

| # | Product Number Unit | Component | XDI wt % | HDI Isocyanurate wt % | NCO(%) (%) |
|---|---|---|---|---|---|
| 1 | Lexp 11-1 | Isocyanate Compound | 30 | 70 | 28.7 |
| 2 | Lexp 11-2 | Isocyanate Compound | 10 | 90 | 24.1 |
| 3 | Lexp 11-3 | Isocyanate Compound | 50 | 50 | 33.3 |

Test Example 1

<Measurement Method>

A peel strength test was performed at a room temperature of 24° C. and a humidity of 50% using VGS-1-E produced by Toyo Seiki. Peel strength was measured by fixing an intermediate layer substrate, and pulling an inner layer substrate at 180 degrees in the peel direction when the peeling was performed between the intermediate layer substrate and the inner layer substrate or pulling an outer layer substrate at 180 degrees in the peel direction when the peeling was performed between the outer layer substrate and the intermediate layer substrate. Specimens with a width of 15 mm for peeling were prepared using a double blade cutter. The convex averages of peel strength measured at a peel rate of 100 mm/min and a peel distance of 7 mm were defined as the measured values.

In addition, a pressure cooker test (PCT) was performed as an aging test. The environmental conditions of a temperature of 121° C., a humidity of 100%, and an atmospheric pressure of 2 atm were employed for the PCT.

The initial peel strength was evaluated as follows.
A: 10 N/15 mm or more
B: Less than 10 N/15 mm but 8 N/15 mm or more
C: Less than 8 N/15 mm but 7 N/15 mm or more
D: Less than 7 N/15 mm The peel strength after PCT was evaluated as follows.
A: 8 N/15 mm or more
B: Less than 8 N/15 mm but 7 N/15 mm or more
C: Less than 7 N/15 mm but 6 N/15 mm or more
D: Less than 6 N/15 mm A "state in which sudden peeling of a film can be observed at the moment that the peel strength reaches a certain level in the peel strength measurement" was defined as zipping. Since zipping may not occur in a single measurement, six measurements were made. Those in which zipping as defined above occurred were judged to exhibit zipping.

<Measurement Results>

Table 1 below shows the measurement results. As shown in Table 3, the initial peel strength and the peel strength after PCT were either C, B, or A in all of Examples 1 to 12.

More specifically, the sheets of Examples 1 to 5, 8, and 9 had good adhesion. The sheet of Example 6 had good adhesion, although the virtual EVA adhesion performance was slightly decreased. In Examples 7 and 10, the adhesion performance to each substrate was slightly lower than that of Examples 1 to 5, 8, and 9; however, the sheets of Examples 7 and 10 had good adhesion. Although the initial adhesion performance and the adhesion performance after the heat resistance test were slightly decreased in Example 11, the sheet of Example 11 had good adhesion. In addition, no zipping was observed in any of the Examples.

In contrast, one or more Ds in the initial peel strength and the peel strength after PCT and/or zipping was observed in each of Comparative Examples 1 to 12. More specifically, a decrease in the adhesion performance to each substrate in Comparative Examples 1, 2, and 9, a decrease in initial bonding ability in Comparative Example 3, an occurrence of zipping between PVF/PET in Comparative Example 4, and a decrease in the reaction rate in Comparative Example 10 were confirmed.

Additionally, the initial appearance was impaired due to foaming in Comparative Example 5; a decrease was observed in the initial adhesion performance to each substrate and the adhesion performance to each substrate after the heat resistance test in Comparative Example 6; and a decrease was also observed in the adhesion performance after the heat resistance test in Comparative Example 7. In Comparative Example 8, zipping occurred between PVF/PET.

Further, a comparison of Example 12 and Comparative Example 12 demonstrates that the solar cell rear surface protection sheet of Example 12 maintained good adhesion both at the initial stage and after PCT, even when a poorly adhesive hydrolysis-resistant polyester was used in the solar cell rear surface protection sheet.

TABLE 3

| | Initial Peel Strength (Intermediate Layer/Inner Layer) | Initial Peel Strength (Outer Layer/ Intermediate Layer) | Zipping | Peel Strength after PCT (Intermediate Layer/Inner Layer) | Peel Strength after PCT (Outer Layer/ Intermediate Layer) |
|---|---|---|---|---|---|
| Example 1 | A | B | No | A | B |
| Example 2 | A | B | No | A | B |
| Example 3 | A | B | No | A | B |
| Example 4 | B | B | No | B | B |
| Example 5 | A | B | No | A | B |
| Example 6 | C | B | No | C | B |
| Example 7 | A | C | No | A | C |
| Example 8 | A | B | No | A | B |
| Example 9 | B | B | No | B | B |
| Example 10 | B | C | No | B | C |
| Example 11 | B | C | No | B | C |
| Example 12 | B (Outer Layer/ Inner Layer) | — | No | A (Outer Layer/ Inner Layer) | — |
| Comp. Example 1 | D | D | No | D | D |
| Comp. Example 2 | D | C | No | D | D |
| Comp. Example 3 | D | D | No | D | D |
| Comp. Example 4 | B | B | Observed | B | B |
| Comp. Example 5 | B | D | No | B | D |
| Comp. Example 6 | D | D | No | D | D |
| Comp. Example 7 | D | D | No | D | D |
| Comp. Example 8 | B | B | Observed | B | B |
| Comp. Example 9 | D | D | Observed | D | D |
| Comp. Example 10 | B | B | No | D | D |
| Comp. Example 11 | C | C | No | D | D |
| Comp. Example 12 | D (Outer Layer/ Inner Layer) | — | No | D (Outer Layer/ Inner Layer) | — |

DESCRIPTION OF REFERENCE NUMERALS

1. Solar Cell Module
10. Solar Cell Rear Surface Protection Sheet
11. Film
12. Film
13. Adhesive
20. Sealing Member
30. Power Generation Cells
40. Glass Plate
50. Frame

The invention claimed is:

1. A solar cell rear surface protection sheet comprising two or more substrates laminated together by means of an adhesive, the adhesive comprising a urethane resin obtained by mixing an acrylic polyol, an isocyanate compound, 3-glycidoxypropyltriethoxysilane, and tin ocrylate;
   (1) the acrylic polyol being an acrylic polyol obtained by polymerizing polymerizable monomers, the polymerizable monomers comprising a hydroxyl group-containing monomer and other monomers, the other monomers comprising acrylonitrile, the acrylonitrile being present in an amount of 5.0 to 15.0 wt % based on the total weight (100 wt %) of the polymerizable monomers;
   (2) the isocyanate compound comprising both a xylylene diisocyanate monomer and hexamethylene diisocyanate isocyanurate, wherein, based on the total weight (100 wt %) of the xylylene diisocyanate monomer and the hexamethylene diisocyanate isocyanurate, the xylylene diisocyanate monomer is present in an amount of 20 to 40 wt %, and the hexamethylene diisocyanate isocyanurate is present in an amount of 80 to 60 wt %;
   (3) the equivalent ratio of isocyanate groups of the xylylene diisocyanate monomer and the hexamethylene diisocyanate isocyanurate to hydroxyl groups of the acrylic polyol being 1.0 to 3.0.

2. The solar cell rear surface protection sheet according to claim 1, wherein the two or more substrates are an outer layer substrate and an inner layer substrate, and the inner layer substrate is positioned in such a manner that the inner layer substrate faces power generation cells when a solar cell module is formed using the solar cell rear surface protection sheet.

3. The solar cell rear surface protection sheet according to claim 2, which comprises an intermediate layer substrate between the outer layer substrate and the inner layer substrate.

4. The solar cell rear surface protection sheet according to claim 1, wherein the acrylic polyol has a glass transition temperature of −10° C. to 10° C.

5. The solar cell rear surface protection sheet according to claim 1, wherein the acrylic polyol has a hydroxyl value of 5 to 30 mgKOH/g.

6. The solar cell rear surface protection sheet according to claim 2, wherein the outer layer substrate and/or the inner layer substrate is formed by coating.

7. The solar cell rear surface protection sheet according to claim 1, wherein the inner layer substrate comprises at least one member selected from the group consisting of ethylene-vinyl acetate copolymers (EVA) and low-density polyethylenes.

8. The solar cell rear surface protection sheet according to claim 1, wherein the intermediate layer substrate comprises at least one member selected from the group consisting of polyesters, polyethylene naphthalates (PEN), polycarbonates, acrylic, polyamides, and polyphenylene ethers.

9. The solar cell rear surface protection sheet according to claim 1, wherein the intermediate layer substrate comprises an aluminum foil and/or an inorganic vapor deposited film.

10. The solar cell rear surface protection sheet according to claim 2, wherein a fluorine-containing coating and/or an acrylic coating is formed on an outer surface of the outer layer substrate.

11. The solar cell rear surface protection sheet according to claim 2, wherein the outer layer substrate comprises at least one member selected from the group consisting of fluorine-containing films, polyester films, and inorganic vapor deposited films.

12. A solar cell module comprising the solar cell rear surface protection sheet according to claim 1.

* * * * *